United States Patent
Asaoka et al.

(10) Patent No.: US 6,531,381 B2
(45) Date of Patent: Mar. 11, 2003

(54) METHOD AND APPARATUS FOR CLEANING SEMICONDUCTOR DEVICE AND METHOD OF FABRICATING SEMICONDUCTOR DEVICE

(75) Inventors: Yasuhiro Asaoka, Hyogo (JP); Hiroshi Tanaka, Hyogo (JP); Naoki Yokoi, Hyogo (JP); Seiji Muranaka, Hyogo (JP); Toshihiko Nagai, Osaka (JP)

(73) Assignees: Mitsubishi Denki Kabushiki Kaisha, Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/998,692

(22) Filed: Dec. 3, 2001

(65) Prior Publication Data

US 2002/0177310 A1 Nov. 28, 2002

(30) Foreign Application Priority Data

May 25, 2001 (JP) ........................................ 2001-156472

(51) Int. Cl.$^7$ ............................................... H01L 21/20
(52) U.S. Cl. ........................................ 438/584; 438/3
(58) Field of Search ................................ 438/580, 584, 438/570, 3; 257/76

(56) References Cited

U.S. PATENT DOCUMENTS

| 4,206,540 | A | * | 6/1980 | Gould | 148/DIG. 139 |
| 6,096,629 | A | * | 8/2000 | Tsai et al. | 438/570 |
| 6,103,009 | A | * | 8/2000 | Atoji | 117/91 |
| 6,221,788 | B1 | * | 4/2001 | Kobayashi et al. | 257/76 |
| 6,245,650 | B1 | * | 6/2001 | Watanabe | 438/3 |
| 6,303,479 | B1 | * | 10/2001 | Snyder | 438/197 |

FOREIGN PATENT DOCUMENTS

JP 11-111660 4/1999

* cited by examiner

Primary Examiner—John F. Niebling
Assistant Examiner—Olivia Luk
(74) Attorney, Agent, or Firm—McDermott, Will & Emery

(57) ABSTRACT

Disclosed is a method for removing Pt (or Pt—Ir) and BST contaminants on the surface edge, back, and bevel of a semiconductor wafer. A wafer on which a stacked film selected from the group of a Pt film, a Pt—Ir film, and a Ba—Sr—Ti film is formed is prepared. A chemical containing hydrochloric acid is applied only to the surface edge, back, and bevel of the wafer. The surface edge, back, and bevel of the wafer are rinsed with pure water. Further, a chemical containing hydrogen fluoride is applied. The surface edge, back, and bevel of the wafer are rinsed again with pure water.

7 Claims, 3 Drawing Sheets

METHOD AND APPARATUS FOR CLEANING SEMICONDUCTOR DEVICE AND METHOD OF FABRICATING SEMICONDUCTOR DEVICE

BACKGROUND OF THE INVENTION

1. Field of the Invention

The present invention generally relates to a method of cleaning a semiconductor device. More particularly, the invention relates to a method of cleaning a semiconductor device, improved to remove Pt (Pt—Ir) and BST contaminants on a surface edge, a back, and a bevel of a semiconductor wafer. The invention relates to an apparatus for cleaning a semiconductor device, which realizes such a cleaning method. The invention also relates to a method of fabricating a semiconductor device, employing the cleaning method.

2. Description of the Background Art

In order to reduce the size of a semiconductor device (particularly, a dynamic random access memory (DRAM)), as dielectric materials of a capacitor, a Ba—Sr—Ti oxide (hereinbelow, described as BST) has started to be used. As a material of a capacitor electrode, Pt or Pt—Ir has started to be used. In the case of using new materials, it is important to suppress expansion of contamination by the metal elements (Ba, Sr, Ti, Pt, and Ir) on the production line. The following can be considered as one of flows in which the contamination expansion occurs.

(1) At the time of formation of a Pt (or Pt—Ir) film and a BST film, the films are formed not only on the surface of the semiconductor wafer but also on the back and the bevel edge of the wafer.

(2) The wafer on which the Pt (Pt—Ir) film and the BST film are formed is housed in a housing and carrying cassette and carried to an apparatus for performing the subsequent process. At this time, the surface edge, back, and bevel of the wafer come into contact with and rub against the cassette (cassette groove) and the groove portion of the cassette is contaminated by Ba, Sr, Ti, Pt, and Ir.

(3) When the wafer on which the Pt (Pt—Ir) film and the BST film are formed is carried to an apparatus of the subsequent process, a carrier system comes into contact with the surface edge, back surface edge, and bevel of the wafer. At this time, the carrier system is contaminated by Ba, Sr, Ti, Pt, and Ir.

(4) A semiconductor wafer whose surface edge, back, and bevel are not contaminated by Ba, Sr, Ti, Pt, and Ir is housed in the housing and carrying cassette used in (2). At this time, the surface edge, back, and bevel of the wafer come into contact with and rub against the cassette, and the Ba, Sr, Ti, Pt, and Ir contamination is transferred from the contaminated groove portion of the cassette to the not-contaminated semiconductor wafer.

(5) A semiconductor wafer whose surface edge, back, and bevel are not contaminated by Ba, Sr, Ti, Pt, and Ir is processed by the apparatus in (3). At this time, the surface edge, back, and bevel of the wafer come into contact with the carrier system, and the Ba, Sr, Ti, Pt, and Ir contamination is transferred from the carrier system to the wafer.

(6) By the wafer to which the contamination is transferred in (4) and (5), the contamination is expanded in (1) to (3) in the flow.

In order to prevent expansion of contamination via the carrier system (manufacturing process apparatus and housing and carrying cassette), after forming a Pt (Pt—Ir) film and a BST film in the semiconductor fabricating process, it is necessary to remove the BST film and the Pt (or Pt—Ir) film adhered on the surface edge, back, and bevel of the wafer, or remove contaminants of Ba, Sr, Ti, Pt, and Ir.

As a contamination removing method, after forming the Pt (Pt—Ir) film and the BST film, a chemical capable of etching the films is applied on only the surface edge, back, and bevel of a wafer to remove the films by etching.

It is also possible to perform a cleaning process after a process of forming a single film of BST-Pt (Pt—Ir) to remove the contaminants. However, in a normal capacitor forming flow, immediately after forming a dielectric film, an upper electrode film is formed. If the time of this period becomes long, an organic material existing in the atmosphere in a clean room is adhered to the wafer, and there is the possibility that increase in resistance is caused and the electric characteristics of the capacitor deteriorate. Consequently, the BST film and the Pt (Pt—Ir) film are successively formed and, subsequently, a Pt (Pt—Ir)-BST stacked film is formed.

According to another method of applying an etchant to the surface edge, back, and bevel of a wafer, a resist is applied on the whole surface of the wafer. After that, in order to remove the resist at the surface edge from which the contaminant is desired to be removed by dissolving, the surface edge of the wafer is rinsed. The surface of the wafer except for the edge is protected with a resist and, after that, the whole wafer is soaked in a cleaning fluid. The wafer is cleaned with water and dried and, after that, the resist is removed. In such a manner, the contaminants on the surface edge, back, and bevel edge are removed. In the method, however, in addition to the cleaning process, the resist protecting and removing process has to be performed. At the time of removing the resist, there is the possibility that a damage (including etching) and contamination of an organic material are given to the upper electrode and the wafer surface, and the electric characteristics deteriorate.

SUMMARY OF THE INVENTION

An object of the invention is, therefore, to provide a method of removing contaminants of Ba, Sr, Ti, Pt, and Ir existing on the surface edge, back, and bevel of a wafer by a single cleaning process even in the case where a (granular) Pt(Pt—Ir) deposit exists at the surface edge of the wafer after forming a Pt(Pt—Ir)-BST stacked film.

Another object of the invention is to provide a method of cleaning a semiconductor device, capable of applying a cleaning chemical only to a surface edge, back, and bevel of a wafer and removing contaminants by a single process without damaging an upper electrode and the wafer surface.

Further another object of the invention is to provide an apparatus for cleaning a semiconductor device, capable of realizing the cleaning method.

Further another object of the invention is to provide a method of fabricating a semiconductor device, including the method of cleaning a semiconductor device.

In a method of cleaning a semiconductor device according to a first aspect of the invention, first, a wafer having a surface on which a stacked film selected from the group of a Pt film, a Pt—Ir film, and a Ba—Sr—Ti film is formed is prepared (step 1). Only the surface edge, back, and bevel of the wafer are selectively cleaned (step 2).

According to a preferable embodiment of the invention, in the second step, first, a chemical containing hydrochloric acid is applied only to the surface edge, back, and bevel of the wafer. Only the surface edge, back, and bevel of the wafer are rinsed with pure water. A chemical containing hydrogen fluoride is applied only to the surface edge, back, and bevel of the wafer, and only the surface edge, back, and bevel of the wafer are rinsed again with pure water. After that the wafer is dried.

According to a further preferable embodiment of the invention, as the chemical containing hydrochloric acid, a solution of hydrochloric acid and hydrogen peroxide is used.

According to further another embodiment of the invention, as the chemical containing hydrochloric acid, a solution of hydrochloric acid and nitric acid is used.

As the solution of hydrochloric acid and nitric acid, a solution having the mixing ratio of hydrochloric acid of 30 wt % and nitric acid of 70 wt %=3:1 is used.

According to a preferable embodiment of the invention, as a chemical containing hydrogen fluoride, an organic solvent in which ammonium fluoride is dissolved is used.

According to a further preferable embodiment of the invention, in the step of applying the chemical containing hydrochloric acid only to the surface edge, back, and bevel of the wafer, first, the wafer is rotated. $N_2$, dry air, or pure water is discharged toward the surface of the wafer. The chemical is discharged toward the back of the wafer.

In a method of fabricating a semiconductor device according to a second aspect of the invention, first, a stacked film selected from the group of a Pt film, a Pt—Ir film, and a Ba—Sr—Ti film is formed on the surface of a wafer. Only the surface edge, back, and bevel of the wafer are selectively cleaned.

An apparatus for cleaning a semiconductor device according to a third aspect of the invention includes: means for rotating a wafer; wafer surface-side discharging means for discharging $N_2$, dry air, or pure water toward the surface of the wafer to thereby protect the surface of the wafer; and wafer back-side discharging means for discharging said chemical or pure water toward the back of said wafer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
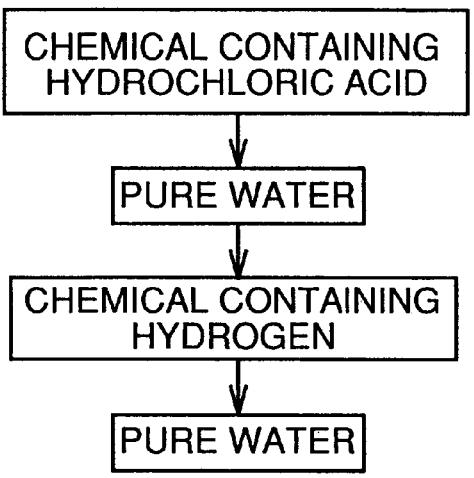
FIG. 1 is a diagram showing the flow of a first embodiment.

Embodiments of the invention will be described hereinbelow.
First Embodiment
FIG. 1 is a diagram showing a cleaning flow of the embodiment.

Figure 2:
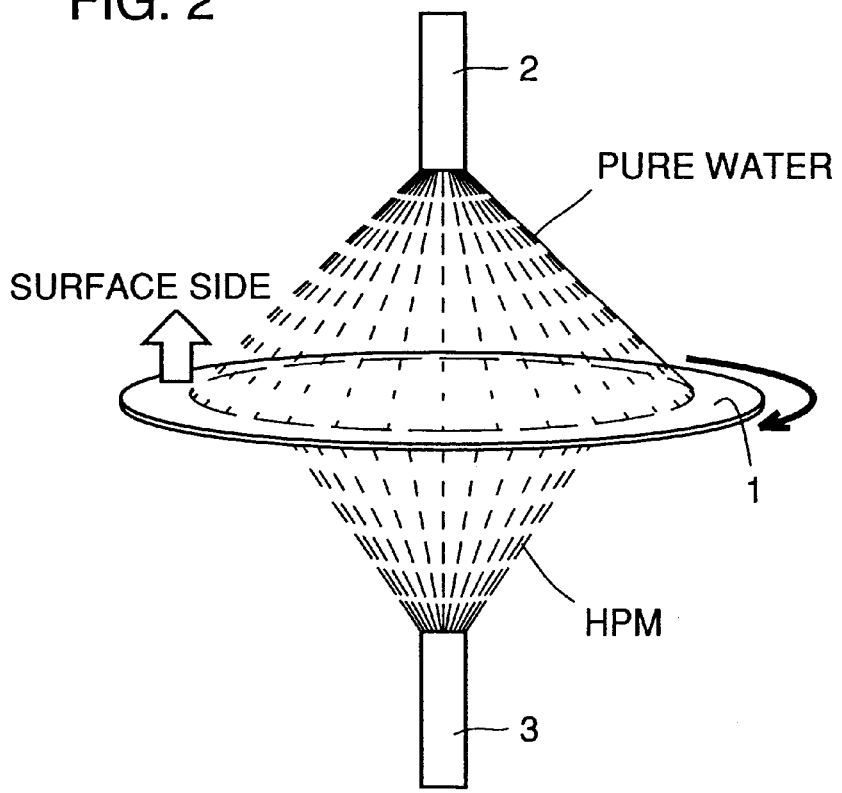
FIG. 2 is a diagram for explaining a method of cleaning a semiconductor device in the first embodiment.

FIG. 2 is a conceptual diagram of a cleaning apparatus. The cleaning apparatus has a motor (not shown) for rotating a semiconductor wafer 1. The apparatus has a wafer surface-side discharge nozzle 2 for discharging $N_2$, dry air, or pure water toward the surface of semiconductor wafer 1, thereby protecting the surface of semiconductor wafer 1, and a wafer back-side discharge nozzle 3 for discharging a chemical or pure water toward the back of semiconductor wafer 1.

The operation will now be described. On the surface of semiconductor wafer 1, a BST film having a thickness of 60 mm is formed (not shown). After that, a Pt film having a thickness of 50 mm is formed (not shown). Wafer 1 is rotated at an arbitrary rotational speed in a range from 500 to 1000 rpm. At a time point when the rotational speed reaches the arbitrary rotational speed in the range from 500 to 1000 rpm, pure water is started to be discharged from wafer surface-side discharge nozzle 2 toward the surface of wafer 1 and a solution of hydrochloric acid and hydrogen peroxide (hereinbelow, described as HPM) is discharged from wafer back-side discharge nozzle 3 toward the back of wafer 1.

The pure water discharged toward the surface side of wafer 1 is used to protect the surface of the wafer. The flow rate of the pure water is 1 to 3 l/min. The mixture ratio of HPM to the back of the wafer, that is, hydrochloric acid (having concentration of hydrogen chloride of 30 wt %):hydrogen peroxide water (having concentration of hydrogen peroxide of 30 wt %):pure water is 1:1:5, and the temperature of the HPM is 75° C.

By the process, the HPM is applied to only the whole back and bevel of the wafer, and the Pt contaminant on the portions is dissolved and removed.

The diameter of the discharge hole of each of nozzles 2 and 3 on the surface and back sides is 3 to 10 mm. The discharge hole is positioned over the center of the wafer. The distance from wafer 1 to each of nozzles 2 and 3 is 100 mm or shorter and is arbitrary as long as nozzles 2 and 3 do not come into contact with wafer 1.

Figure 3:
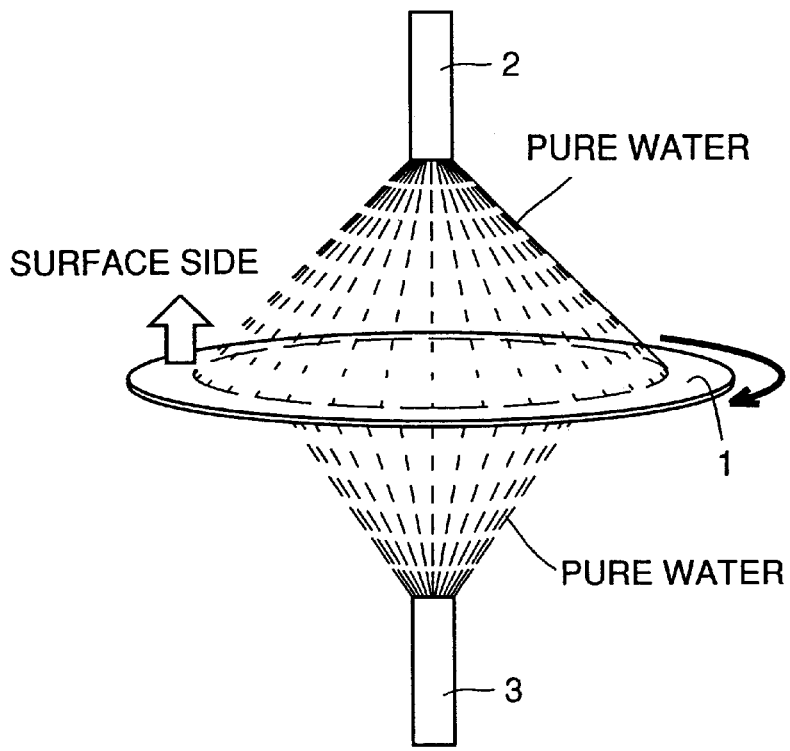
FIG. 3 is a diagram showing a first step of a semiconductor device cleaning method as another embodiment.

Referring to FIG. 3, in 60 seconds from the start of discharge of the HPM, the discharge of the HPM from back-side nozzle 3 is stopped and discharge of pure water from back-side nozzle 3 is started. The flow rate of the pure water is 1 to 3 l/min. During this period, the pure water remains discharged from surface-side nozzle 2.

Figure 4:
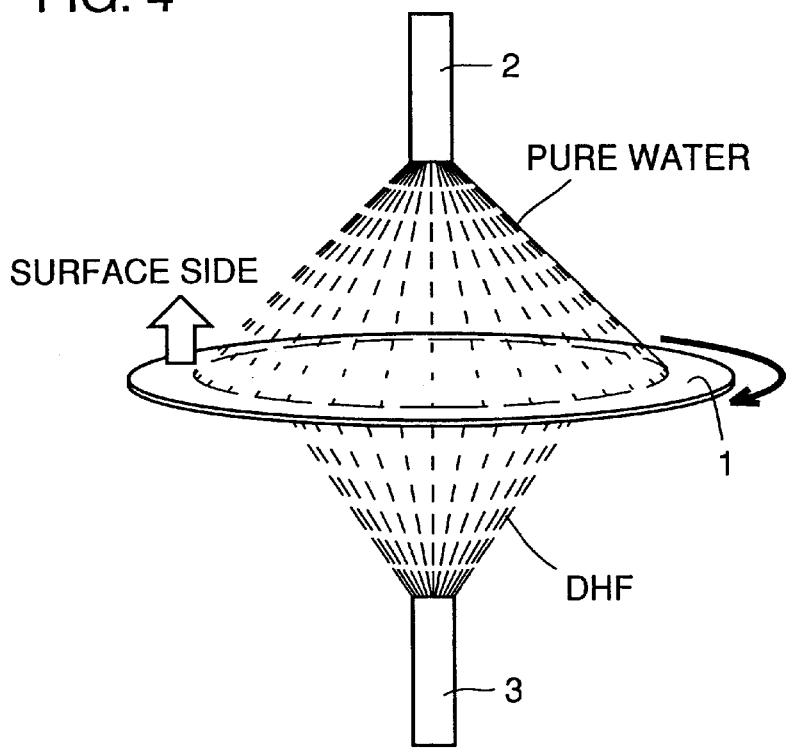
FIG. 4 is a diagram showing a second step of the semiconductor device cleaning method as the another embodiment.

Referring to FIG. 4, in 30 seconds from the start of the discharge of pure water from back-side nozzle 3, the discharge of the pure water from back-side nozzle 3 is stopped, and discharge of dilute hydrogen fluoride (abbreviated as DHF) is started from back-side nozzle 3. The mixing ratio of DHF is hydrofluoric acid (having concentration of hydrogen fluoride of 50 wt %):pure water=1:10, and the temperature of the DHF is 25° C. The flow rate of the DHF is 1 to 3 l/min. During this period as well, pure water remains discharged from surface-side nozzle 2.

By the process, the DHF is applied on the whole back and the bevel of the wafer and the Ba, Sr, and Ti contaminants in this portions are dissolved and removed.

Figure 5:
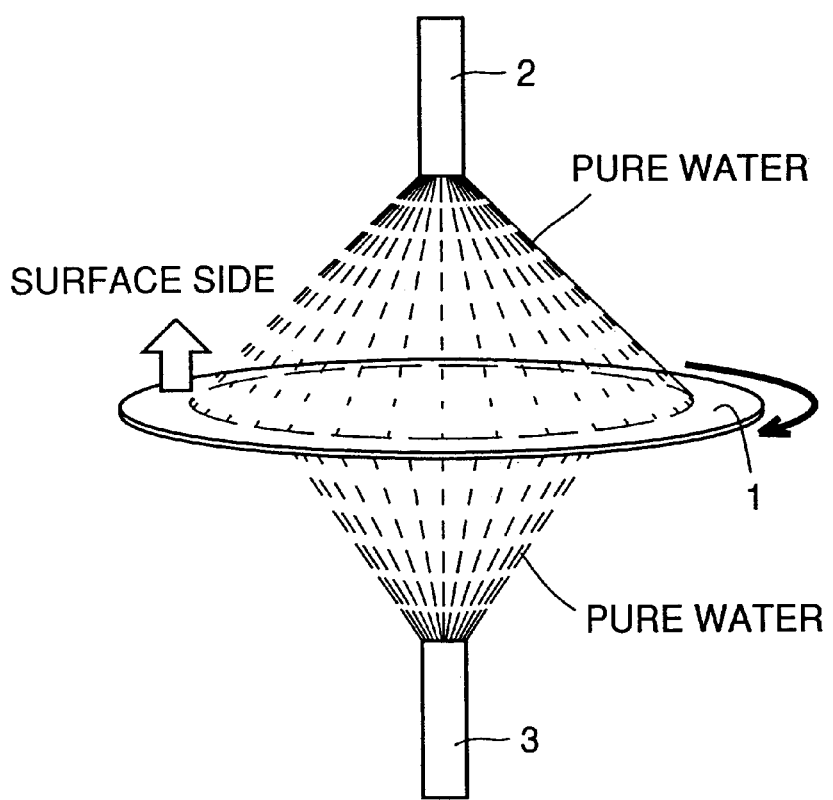
FIG. 5 is a diagram for explaining a semiconductor device cleaning method as further another embodiment.

Referring to FIG. 5, in 30 seconds after the start of discharge of DHF, the discharge of DHF from back-side nozzle 3 is stopped and discharge of pure water from back-side nozzle 3 is started. The flow rate of the pure water is 1 to 3 l/min. During this period as well, the pure water remains discharged from surface-side nozzle 2.

In 30 seconds after the start of the discharge of pure water from back-side nozzle 3, the discharge of the pure water from both surface-side and back-side nozzles 2 and 3 is stopped, and the rotational speed of the wafer is increased from an arbitrary rotational speed in a range from 500 to 1000 rpm to an arbitrary rotational speed in a range from 1500 to 2000 rpm. From the time point when the rotational speed reaches the arbitrary rotational speed in the range from 1500 to 2000 rpm, the state is kept for 30 seconds to dry the surface and back of wafer 1.

By performing the process of the flow once, the Pt, Ba, Sr, and Ti contaminants on the back and bevel of the wafer are removed.

Also in the case where the Pt film formed on the BST film is a Pt—Ir film, by performing the process of the flow once, the Pt, Ir, Ba, Sr, and Ti contaminants on the back and the bevel of the wafer are removed. On the other hand, since a chemical or the like is not applied on the surface of wafer 1, the surface of wafer 1 is protected.

Although the case where the DHF is obtained by dissolving hydrogen fluoride into pure water has been described in the embodiment, any chemical which dissolves hydrogen fluoride can be used. In this case, proper processing parameters have to be set for each chemical.

In the flow, when the order of discharging the chemicals toward the back of the wafer is reversed (DHF→HPM), although the Pt contaminant can be removed, the Ba, Sr, and Ti contaminants cannot be removed and remain.

This occurs for the following reason. The Pt contaminant (Pt film and Pt) existing on the BST film cannot be removed by etching using the DHF, and the remained Pt becomes a protection mask of the BST film, so that the Ba, Sr, and Ti contaminants (BST film) remain. By the subsequent discharge of the HPM, the Pt contaminant as the mask when the DHF is discharged is removed. However, since the etching rate of the BST film which remains due to the Pt contamination is low, even after the HPM process, the Ba, Sr, and Ti contaminants (BST film) remain. It is therefore important that the discharge order of the chemicals from back nozzle 3 is HPM and then DHF.

Second Embodiment

The first embodiment is modified by setting the rotational speed of the wafer to 200 rpm in the processes other than the drying process and setting the discharge flow rate of the chemical toward the back to 2.0 l/min. With the parameters, the chemicals (HPM and DHF) toward the back are also applied to the surface edge, to thereby remove the Pt, Ir, Ba, Sr, and Ti contaminants on the surface edge, back, and bevel portion of the wafer.

Third Embodiment

Although pure water is discharged from the wafer surface-side nozzle in the first embodiment, in place of pure water, nitrogen may be discharged. The flow rate of nitrogen is 200 l/min. In place of nitrogen, dry air may be discharged. Also in the case of discharging nitrogen or dry air, by adjusting the rotational speed and the discharge amount of the chemical toward the back, the range of removing a contaminant (chemical application range) is not limited to only the wafer back and bevel but can be expanded to the surface edge. Also by adjusting the flow rate of nitrogen or dry air, the range in which contaminants are removable can be adjusted.

Fourth Embodiment

Although the chemical discharged first toward the back is HPM in the first embodiment, in place of the HPM, a solution of nitric acid and hydrochloric acid may be discharged. The discharge time is 30 seconds and the discharge flow rate is 1.0 l/min. The mixture ratio of the solution between nitric acid (having concentration of nitric acid: 70 wt %) and hydrochloric acid (having concentration of hydrogen chloride: 30 wt %) is 1:3. The solution is commonly called aqua regia. The temperature of the solution is 45° C. By using aqua regia in place of the HPM, improved removability of the Pt contaminant is achieved, and discharge time can be shortened to 30 seconds.

In a manner similar to the second and third embodiments, by adjusting the rotational speed, the flow rate of the chemical on the back side, and flow rate of each of the pure water, nitrogen, and dry air on the surface side, the range of removing contaminants (chemical application range) can be adjusted.

The embodiments disclosed herein are to be considered in all respects as illustrative and not restrictive. The scope of the invention is indicated by the appended claims rather than by the foregoing description and all changes which come within the meaning and range of equivalency of the claims are therefore intended to be embraced therein.

As described above, by the method of cleaning a semiconductor device according to the invention, only the surface edge, back, and bevel of a wafer are selectively cleaned. Thus, while protecting the surface of the wafer, contaminants can be removed.

The apparatus for cleaning a semiconductor device according to the invention selectively cleans only the surface edge, back, and bevel of a wafer, so that contaminants can be removed while protecting the surface of the wafer.

In the method of manufacturing a semiconductor device according to the invention, only the surface edge, back, and bevel of a wafer are selectively cleaned. Thus, contaminants can be removed while protecting the surface of the wafer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of cleaning a semiconductor device, comprising the steps of:

preparing a wafer having a back surface and a front surface on which a stacked film selected from the group of a Pt film, a Pt—Ir film, and a Ba—Sr—Ti film is formed;

discharging $N_2$, air or pure water toward the front surface of said wafer; and selectively discharging a cleaning chemical toward the back surface of said wafer while discharging $N_2$, air or pure water toward the front surface of said wafer.

2. A method of cleaning a semiconductor device, comprising the steps of:

preparing a wafer having a surface on which a stacked film selected from the group of a Pt film, a Pt—Ir film, and a Ba—Sr—Ti film is formed;

applying a chemical containing hydrochloric acid only to the surface edge, back, and bevel of said wafer;

rinsing only the surface edge, back, and bevel of said wafer with pure water;

applying a chemical containing hydrogen fluoride only to the surface edge, back, and bevel of said wafer; and rinsing again only the surface edge, back, and bevel of said wafer with pure water.

3. The method of cleaning a semiconductor device according to claim 2, wherein as said chemical containing hydrochloric acid, a solution of hydrochloric acid and hydrogen peroxide is used.

4. The method of cleaning a semiconductor device according to claim 2, wherein as said chemical containing hydrochloric acid, a solution of hydrochloric acid and nitric acid is used.

5. The method of cleaning a semiconductor device according to claim 4, wherein as the solution of hydrochloric acid and nitric acid, a solution having the mixing ratio of hydrochloric acid of 30 wt % and nitric acid of 70 wt %=3:1 is used.

6. The method of cleaning a semiconductor device according to claim 2, wherein as a chemical containing hydrogen fluoride, an organic solvent in which ammonium fluoride is dissolved is used.

7. The method of cleaning a semiconductor device according to claim 2, wherein said step of applying the chemical containing hydrochloric acid only to the surface edge, back, and bevel of said wafer comprises:

a step of rotating said wafer;

a step of discharging $N_2$, dry air, or pure water toward the surface of said wafer; and a step of discharging said chemical toward the back of said wafer.

* * * * *